(12) United States Patent
Organtini et al.

(10) Patent No.: US 12,439,708 B2
(45) Date of Patent: Oct. 7, 2025

(54) METHOD FOR MANUFACTURING A BACKSIDE ILLUMINATION OPTICAL SENSOR WITH IMPROVED DETECTION PARAMETERS

(71) Applicant: LFOUNDRY S.R.L., Avezzano (IT)

(72) Inventors: Paolo Organtini, Avezzano (IT); Giovanni Margutti, Avezzano (IT)

(73) Assignee: LFOUNDRY S.R.L., Avezzano (IT)

( * ) Notice: Subject to any disclaimer, the term of this patent is extended or adjusted under 35 U.S.C. 154(b) by 750 days.

(21) Appl. No.: 17/642,511

(22) PCT Filed: Sep. 14, 2020

(86) PCT No.: PCT/EP2020/075657
§ 371 (c)(1),
(2) Date: Mar. 11, 2022

(87) PCT Pub. No.: WO2021/052912
PCT Pub. Date: Mar. 25, 2021

(65) Prior Publication Data
US 2022/0344387 A1 Oct. 27, 2022

(30) Foreign Application Priority Data
Sep. 18, 2019 (IT) .................. 102019000016523

(51) Int. Cl.
*H10F 39/12* (2025.01)
*H10F 39/00* (2025.01)

(52) U.S. Cl.
CPC ......... *H10F 39/199* (2025.01); *H10F 39/014* (2025.01); *H10F 39/807* (2025.01)

(58) Field of Classification Search
CPC ............. H01L 27/1464; H01L 27/1463; H01L 27/14689; H01L 27/1462; H01L 27/14685
See application file for complete search history.

(56) References Cited

U.S. PATENT DOCUMENTS

| | | | |
|---|---|---|---|
| 10,211,244 B2* | 2/2019 | Fang | H10F 39/807 |
| 12,211,880 B2* | 1/2025 | Kim | H10F 39/807 |
| 2012/0025199 A1 | 2/2012 | Chen et al. | |
| 2015/0255495 A1* | 9/2015 | Park | H10F 39/186 257/446 |
| 2018/0061873 A1* | 3/2018 | Lee | H10F 39/8053 |

(Continued)

OTHER PUBLICATIONS

International Search Report, International Application No. PCT/EP2020/075657, dated Dec. 7, 2020, 2 pages.

*Primary Examiner* — Wael M Fahmy
*Assistant Examiner* — Tiberiu Dan Onuta
(74) *Attorney, Agent, or Firm* — Stinson LLP

(57) ABSTRACT

The present invention relates to a method of manufacturing a backside illumination (BSI) CMOS optical sensor and more specifically to a method of reducing the cross talk and enhance the photon detection efficiency (PDE) in a backside illumination (BSI) CMOS optical sensor. In particular the claimed method comprises the step of creating an isolation structure between the adjacent sensing elements of the pixel-array of said BSI CMOS optical sensor, so as to isolate all the adjacent sensing elements from each other, and the step of creating a common voltage backside applying structure to all the sensing elements of said pixel-array, so as to connect all the sensing elements to a common voltage bias.

13 Claims, 7 Drawing Sheets

(56) References Cited

U.S. PATENT DOCUMENTS

| | | |
|---|---|---|
| 2018/0090526 A1 | 3/2018 | Mandai et al. |
| 2018/0114806 A1* | 4/2018 | Kim ................... H10F 39/8063 |
| 2019/0131349 A1* | 5/2019 | Im ........................ H10F 39/802 |
| 2020/0168707 A1* | 5/2020 | Shirota .............. H10D 62/8303 |
| 2020/0274328 A1* | 8/2020 | Park ................... H10H 20/8142 |

* cited by examiner

METHOD FOR MANUFACTURING A BACKSIDE ILLUMINATION OPTICAL SENSOR WITH IMPROVED DETECTION PARAMETERS

CROSS-REFERENCE TO RELATED APPLICATIONS

This patent application is a U.S. national stage application of International Application No. PCT/EP2020/075657, filed Sep. 14, 2020, and claims priority from Italian Patent Application No. 102019000016523, filed Sep. 18, 2019, the entire disclosures of which are incorporated by reference in their entirety for all purposes.

FIELD OF INVENTION

The present invention relates generally to a method for manufacturing a backside illumination (BSI) optical sensor and more specifically to a method for manufacturing a BSI optical sensor having improved detection parameters, like reduced cross talk and enhanced photon detection efficiency (PDE). In particular, the invention provides a method for the isolation of the sensing elements of the BSI optical sensor compatible with the possibility of applying a common voltage bias to the sensing elements.

BACKGROUND

The optical sensors have reached such a level of miniaturization and detection accuracy to be used in many fields.

For example, optical sensors are currently used in automated driving system like ADAS (Advanced Driver Assistance System) to provide for distance measurement. Among this type of optical sensor there is the so-called Time of Flight (TOF) device, which is designed to detect the distance of a target object by measuring the time it takes for an electromagnetic wave (e.g. laser pulse) to return from a target object. The TOF device employs a very high sensitivity sensing element, as it is the Single Photon Avalanche Diodes (SPAD). The main components of a SPAD are: an avalanche photodiode operated above the breakdown voltage (Geiger mode), a quenching resistor, a first electrode (cathode) and a second electrode (anode). An electron-hole pair generated by incoming photon in the photodiode region (e.g. reversed biased p-n junction), which is biased above the breakdown voltage (multiplication region) can trigger an avalanche, due to the multiplication process by impact ionization of the space charge area of the photodiode. In this way a macroscopic electrical current is produced in response to the incident photon flow.

The use of SPAD is not limited to the automotive market, but it is extensively employed in other market, such as the medical one. SPAD arrays (often referred to as Silicon Photo Multiplier or SiPM), has been adopted to replace photomultiplier tube (PMT) technology in photon counting applications, like Positron Emission Tomography (PET) technique, to observe metabolic processes in the body. The implementation of the SPAD technique in CMOS technology has further enhanced the advantage of SiPM technique, providing high dynamic range photon counting in picosecond timing.

Referring again to the automotive market, the LIDAR (Light detection and ranging) technique, for example, employs the Near Infrared (NIR) light detection to measure the time of flight of an emitted laser pulse. In order to be sensitive to the NIR wavelength range, a SPAD-array optical sensor must have a Photo Detection Efficiency (PDE) greater than 10% in the range 850-910 nm of the electromagnetic spectrum. This is very difficult to be achieved with a conventional front side illuminated (FSI) CMOS optical sensor, due to the deep penetration distance of a NIR photon, which is absorbed deeply in the semiconductor substrate (e.g. Silicon substrate), with the consequence that the generated electron/hole pairs have poor chance to be collected in the avalanche photodiode region. Conversely, it can be achieved by a backside illuminated (BSI) CMOS optical sensor, which is configured to have all the sensing elements disposed near the backside surface, where the incoming photon are impinging from and, for this reason, most of the generated electron/hole pairs have more chances to be collected in the avalanche photodiode region.

The major drawback that arises in SPAD array is the cross talk between neighboring sensing elements. The crosstalk may arise due to spurious avalanches in one sensing element that are caused by an avalanche in another sensing element, producing a spurious output current pulse also in absence of light (Dark Current). In order to limit the presence of photons travelling from one SPAD to the adjacent one, thus limiting the probability of triggering a secondary avalanche, (cross talk) and, consequently, the Dark Count Rate (DCR), the individual sensing element must be isolated from each other. Different isolation structures may be used. Generally, the isolation structures may be created in form of a trench etched from the frontside into the substrate adjacent to the sensing element region. Once the trench is formed it is usually filled with dielectric material. For example, according to U.S. Pat. No. 9,741,759 the trench isolation structure has the form of a Deep Trench Isolation (DTI) structure created from the backside of the semiconductor substrate toward the frontside. According to the same US patent, the trench isolation structure is filled with a first isolation material conformally formed on the trench inner wall and a second conductive material conformally formed to fill the inside of the trench isolation structure. Furthermost, according to same US patent, the trench isolation structure is capable to apply voltage by connecting a voltage applying device to the trench isolation structure. Usually, with this kind of isolation, the problem arises because the trench isolation structure isolates the sensing elements from each other, but it makes impossible to connect all the sensing elements to a common voltage bias. For example, in case of a SiPM, each sensing element (SPAD) has the anode electrode connected to certain potential (e.g. ground potential) in order to be reversed biased across the junction. When the SPADs are isolated from each other there is no way to connect the SPAD anode electrodes to a common potential. The only way to overcome this problem is to bias each SPAD separately, for example by adding a single contact to connect each SPAD to the same potential, but this will result in a use of additional space of the array layout, thus decreasing the Fill Factor, defined as the ratio of the sensing area versus the total area of the sensing element, and thus decreasing the photon detection efficiency (PDE).

Hence there is a desire to provide BSI optical sensor with improved characteristic parameters, such as a reduced cross talk and an improved Photo Detection Efficiency (PDE), without affect the Fill Factor.

SUMMARY

A general object of the present invention is, thence, to overcome the aforesaid technical problem that occurs when trying to reduce the cross talk by implementing an optical isolation structure, which isolates the sensing elements of an optical sensor from each other, thus inhibiting each sensitive element to be connected to a common voltage bias.

Moreover, a specific object of the present invention is that of providing a method for manufacturing a backside illumination (BSI) CMOS optical sensor having improved detection parameters, said method comprising the step of creating an isolation structure between the adjacent sensing elements while keeping all sensing elements connected to a common voltage bias.

These and other objects are achieved by the present invention in that it relates to the method of manufacturing an optical sensor, as defined in the appended claims.

According to a first embodiment of the present invention the method of manufacturing a backside illumination (BSI) CMOS optical sensor comprises the following steps: forming an isolation structure surrounding each sensing elements of the pixel-array in the form of trench grid structure, consisting of a first isolation structure (for example a Shallow Trench Isolation (STI) structure, or a LOCOS isolation structure, or an implantation area) created from the front side surface of the optical sensor and a deep trench isolation (DTI) structure etched from the backside surface of the optical sensor, after having thinned the silicon substrate from the backside, and landing in correspondence of the bottom surface of the frontside first isolation structure; filling the backside DTI structure with a first insulating material and a second opaque material (e.g. metal), suitable to reduce the cross talk; planarizing the backside surface of the optical sensor from the backside so as to expose the silicon surface in correspondence of each sensing element; depositing an additional low-resistivity layer on the backside surface, connecting the exposed silicon surface and providing a common voltage applying structure to all sensing elements of the pixel-array. Preferably, the additional low-resistivity layer consists of amorphous-silicon material, which has the advantage to filter the UV and Visible light, allowing only the NIR light to be detected. According to a second embodiment of the present invention, the method of manufacturing a backside illumination (BSI) CMOS optical sensor comprises the following steps: forming an isolation structure surrounding each sensing elements of the pixel-array in the form of staggered lines of trench, each line of trench consisting of trench portions separated by gaps, filled with silicon substrate, which are staggered with respect the trench portions belonging to a parallel line of trench; said isolation structure consisting of a first isolation structure (for example a Shallow Trench Isolation (STI) structure, or a LOCOS isolation structure, or an implantation area) created from the front side surface of the optical sensor and a second deep trench isolation (DTI) structure etched from the thinned backside surface of the optical sensor, and landing in correspondence of the bottom surface of the frontside first isolation structure; filling the backside DTI structure with opaque material, suitable to reduce the cross talk; planarizing the backside surface of the optical sensor so as to expose the silicon backside surface in correspondence of each sensing element and in correspondence of the silicon gaps, said exposed silicon backside surface providing a common voltage applying structure to all the sensing elements of the pixel-array.

BRIEF DESCRIPTION OF THE DRAWINGS

For a better understanding of the present invention, preferred embodiments, which are intended purely by way of example and are not to be construed as limiting, will now be described with reference to the attached drawings (not to scale), where.

DETAILED DESCRIPTION

The following discussion is presented to enable a person skilled in the art to make and use the invention. Various modifications to the embodiments will be readily apparent to those skilled in the art, without departing from the scope of the present invention as claimed. Thus, the present invention is not intended to be limited to the embodiments shown and described, but is to be accorded the widest scope consistent with the principles and features disclosed herein and defined in the appended claims.

As it will be discussed in detail in the following, an aspect of the present invention provides a method of manufacturing a BSI optical sensor, configured to have all the sensing elements (e.g. SPADs) of the pixel-array (e.g. SiPM) separated by an isolation structure in order to decrease the cross talk, said single elements being connected to a common voltage applying structure, provided from the backside of the optical sensor, in a way to not affect the Fill Factor.

Figure 1:
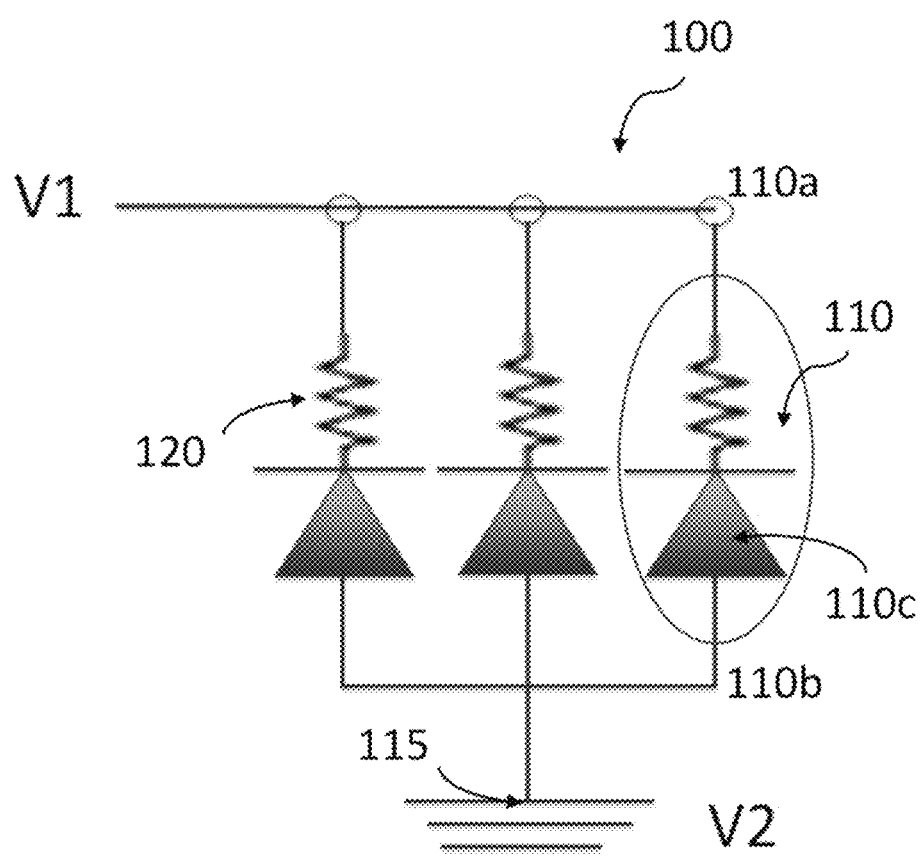
FIG. 1 shows a schematic of the pixel-array of a known semiconductor optical sensor, where the sensing elements are connected in parallel to a common voltage bias.
Figure 2:
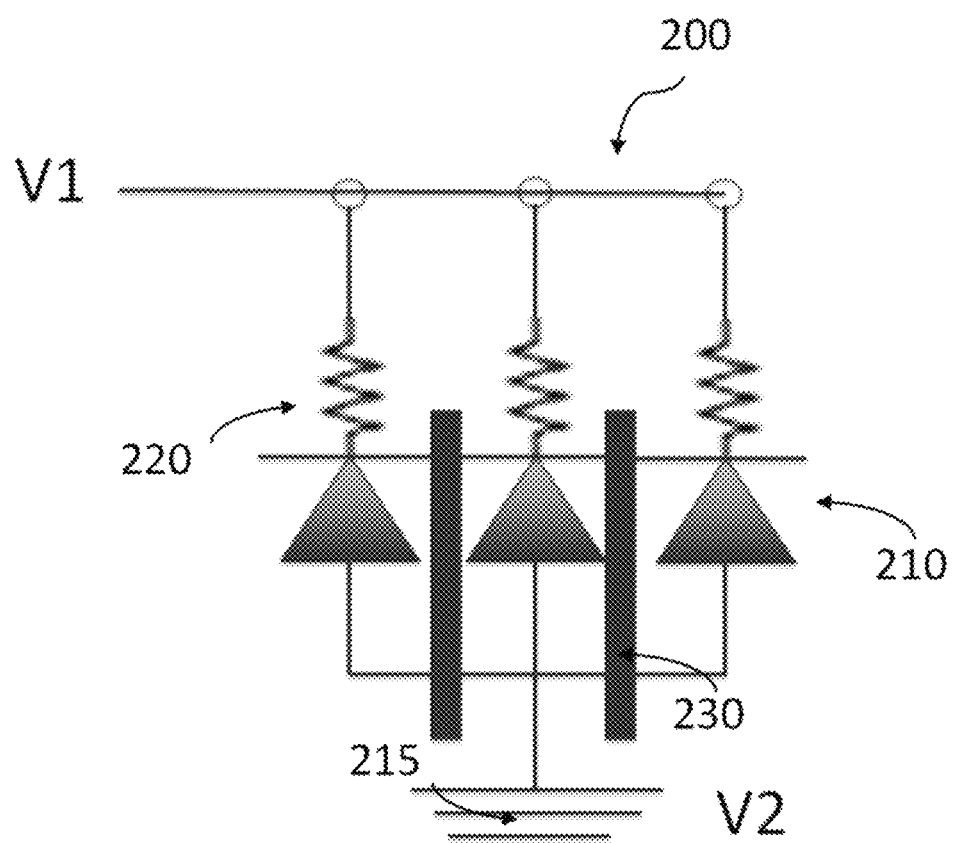
FIG. 2 shows a schematic of the pixel-array of a known semiconductor optical sensor, where the sensing elements are separated by isolation structure (solid bars)
Figure 3:
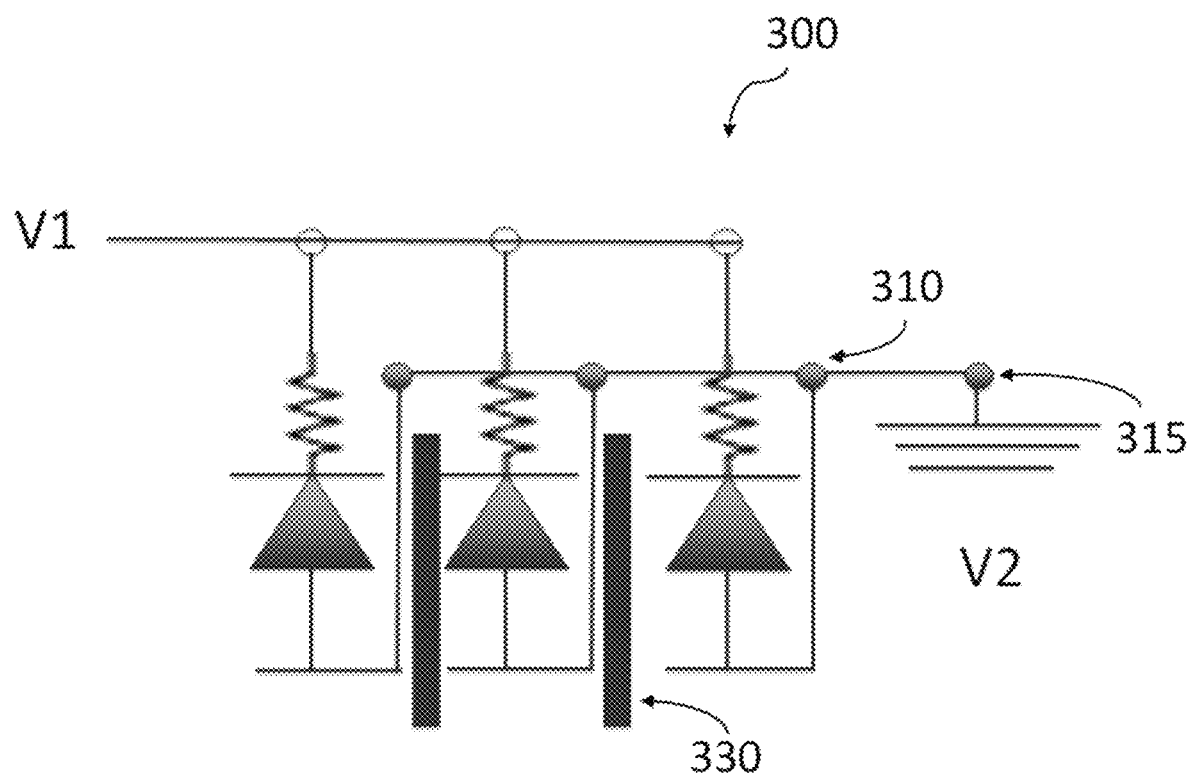
FIG. 3 shows a schematic of the pixel-array of a known semiconductor optical sensor, where the sensing elements are separated by an isolation structure (solid bars) and are connected to a common voltage bias through a single contact included in each sensing element.

FIG. 1-3 schematically illustrates three different pixel-arrays of the optical sensor, consisting of a plurality of sensing elements designed according to well-known layouts.

For example, the schematic depicted in FIG. 1 shows a pixel-array 100 of an optical sensor realized in CMOS technology comprising a plurality of sensing elements 110 (e.g. SPAD), arranged in a two-dimensional matrix, and having a first electrode (110a) connected to a potential V1 and a second electrode (110b) connected to a common potential node V2 (115). In particular, each sensing element is configured to include a photodiode active area (110c), which, in its simplest form, is realized in a p-n (or n-p) reversed biased junctions so that the n (or p) regions are depleted from charge carriers (such as electron/hole pairs) and, thence, incident photons generate electron/hole pairs collected by the depletion regions of the photodiode. The p-n junction is reversed biased to above the breakdown voltage so that, before to be collected, the electron (and the hole) acquires enough energy to create other pairs and initiate an avalanche process, thus amplifying the signal generated by an incident single photon. A quenching resistor, 120, is used to stop the avalanche process. In this way each incoming photon may be detected, resulting in a strong current pulse of few nanosecond duration. In the standard approach the potential V1 is applied consecutively to each first electrode, while the potential V2 (e.g. ground potential) is applied simultaneously to all second electrodes. Hence, all the sensing elements of the pixel-array are connected in parallel to a common voltage bias, V1-V2.

To isolate the SPADs from each other with the aim of reducing the cross talk, the standard method employs a trench isolation structure (solid bar 230 in FIG. 2), filled with conductive material (e.g. metal) or other opaque material. As depicted in FIG. 2, the formation of the trench isolation structure provides for an optical isolation structure, but at the same time, it electrically isolates the sensing elements from each other, making impossible to connect all sensing elements to a common potential, V2.

In FIG. 3 the standard method used to overcome the problem is shown. By this method an additional contact 310 is added to each sensing element, in a way to apply the potential V2 (e.g. ground potential) to each second electrode of each sensing element consecutively. The addition of a contact 310 to each sensing element requires the use of more silicon space of the pixel-array layout, thus decreasing the Fill Factor and thus the PDE.

To overcome the aforementioned problem, the proposed solution provides for a method of manufacturing of a BSI optical sensor according to a first and a second embodiments.

Figure 4:
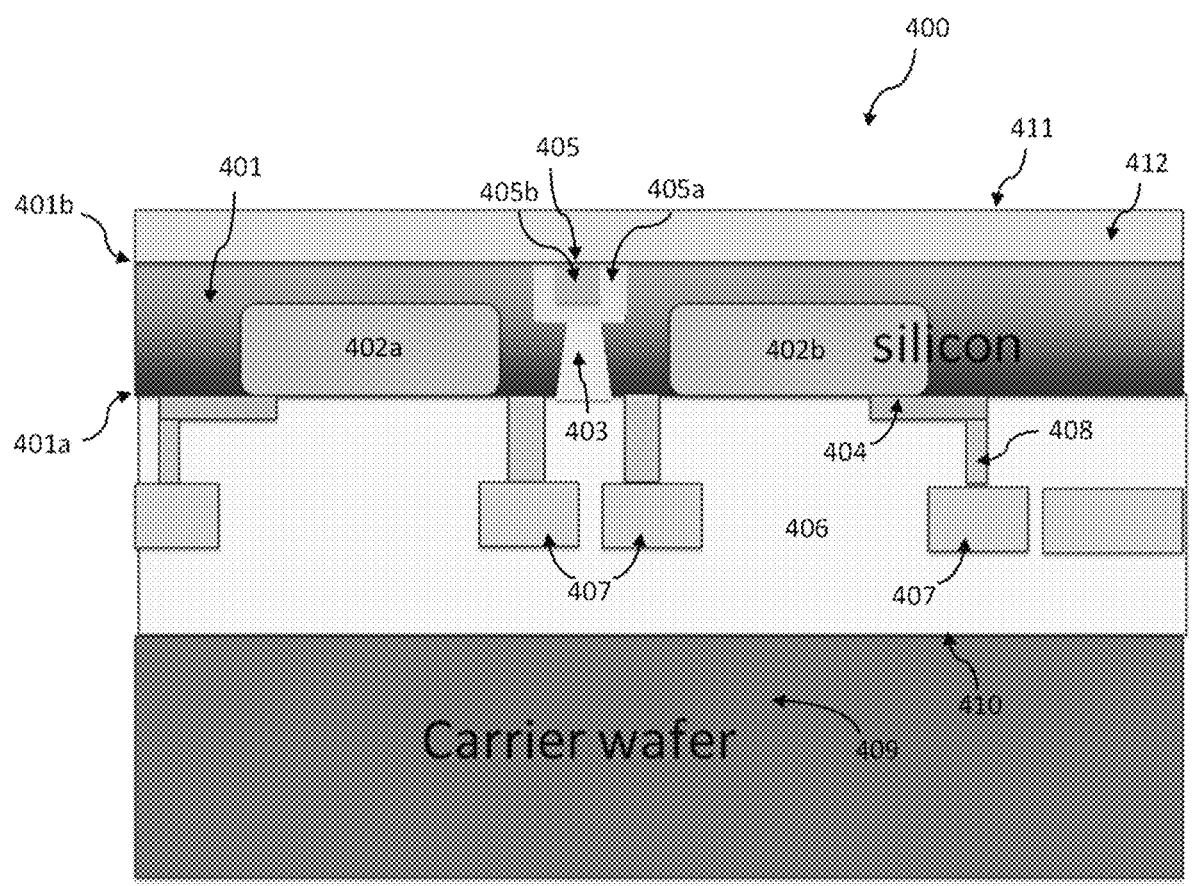
FIG. 4 shows the cross section of a semiconductor BSI optical sensor, obtained with the claimed method, according to a first embodiment.

For a better understanding of the present invention, FIG. 4 shows an example of optical sensor obtained according to a first preferred embodiment of the proposed method. In particular, FIG. 4 is a cross-sectional view of a BSI optical sensor 400, in a particular step of the manufacturing process, including:

- a frontside FS surface 410 and a backside BS surface 411;
- a semiconductor substrate (e.g. silicon substrate) 401 having a first surface 401a and a second surface 401b facing each other;
- at least a first sensing element 402a and a second sensing element 402b formed in said semiconductor substrate 401 and separated by a frontside isolation structure (for example a shallow trench isolation (STI) structure) 403;
- a frontside voltage applying device 404 electrically connected to said at least first or second sensing elements from the FS surface 401a of said semiconductor substrate;
- an insulating layer 406, formed as a multilayer, comprising at least a first interconnection level 407 and a metal contact 408;
- a carrier semiconductor substrate 409 attached to the frontside surface 410 of said optical sensor;
- a backside deep trench isolation (DTI) structure 405, surrounding the at least one and second sensing elements, etched from said BS surface 401b and landing to the bottom side of the FS isolation structure 403, said BS DTI structure being filled with a first insulating material 405a (e.g. Silicon Oxide) covering the side walls and the bottom of the trench and with a second conductive material 405b (e.g. Tungsten) filling the inside of said BS DTI structure;
- an additional low-resistivity layer 412 (e.g. amorphous-silicon layer) deposited on the BS surface 401b and connecting the at least first and second sensing elements 402a and 402b from the semiconductor second surface.

Figure 5:
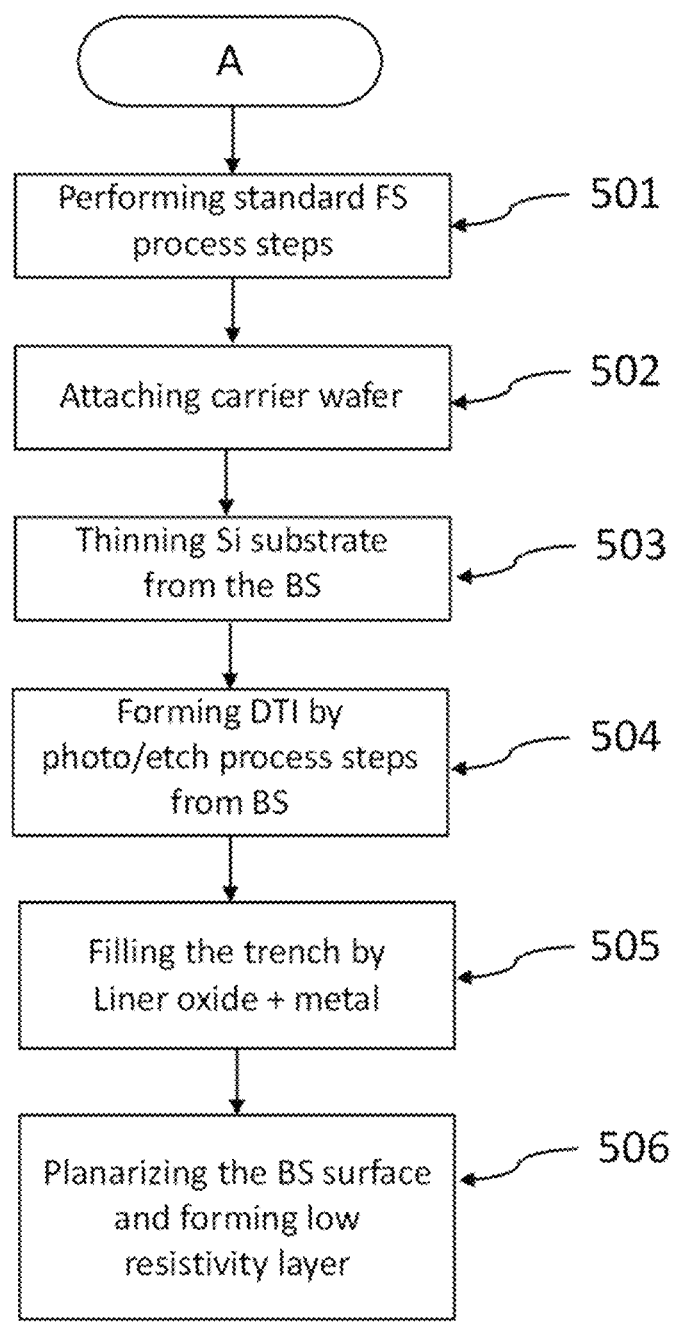
FIG. 5 shows the flow chart illustrating the method of manufacturing of the semiconductor BSI optical sensor according to a first embodiment.

According to a first preferred embodiment of the present invention the BSI optical sensor 400 is manufactured according to the manufacturing process steps illustrated in the flow chart A of FIG. 5. According to this preferred embodiment, the manufacturing process comprises the following manufacturing steps: 501) performing a standard CMOS frontside manufacturing process comprising the steps of forming a FS isolation structure (for example a shallow trench isolation structure (STI)), a plurality of interconnection layers and a plurality of contacts/via structures arranged in a multilevel isolation structure; 502) attaching a carrier wafer to the frontside surface of said multilevel isolation structure; 503) partially thinning the semiconductor substrate from the backside surface; 504) forming BSI deep trench isolation (DTI) structure from backside by Photo/Etch process steps landing at the bottom side of the FS isolation structure, having the form of a grid, surrounding each sensing element region; 505) depositing a first isolation layer covering the trench side and bottom walls of the DTI structure and a second conductive material, like W, Ti/W or Aluminum, filling the internal of the BSI DTI structure; 506) planarizing the backside surface (e.g. by Chemical Mechanical Polishing, CMP) to remove all the conductive material in excess on the backside surface and forming a low resistivity layer by depositing an amorphous-silicon layer, doping said amorphous-silicon layer (e.g. by implantation) and annealing it (e.g. by thermal laser anneal, LTA, or microwave anneal or other methodologies non impacting the underneath layers) to convert the amorphous-silicon layer in a low resistivity layer. Eventually a proper ARC layer can be applied on top of the low resistivity layer to improve the transmission of near infra-red (NIR) radiation.

The advantages of the present invention are clear from the foregoing. In particular, it is important to underline the fact that with the aforementioned method all the at least first and second sensing elements of the optical sensor pixel-array (e.g. SPAD array) are connected to the same backside potential (e.g. ground potential) by contacting the low resistivity layer with only one or very few contacts placed in the front side of the optical sensor (not shown in FIG. 4). It is also advantageous to use amorphous-silicon layer as additional low-resistivity material, because it contributes to filter UV/visible radiation in case of a near infra-red (NIR) light detection.

Figure 6:
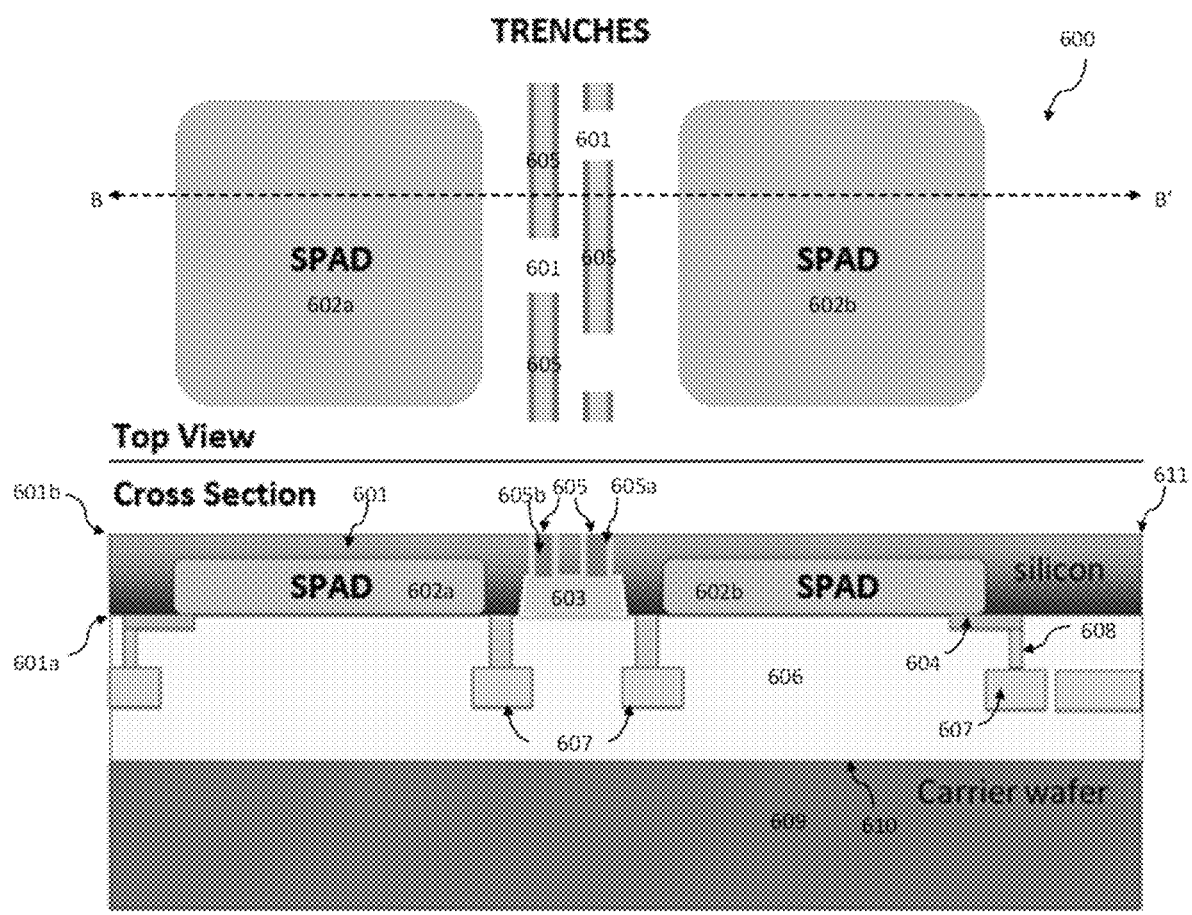
FIG. 6 shows the top-down and the cross section of a semiconductor BSI optical sensor, obtained with the claimed method, according to a second embodiment.

According to a second embodiment of the present invention the BSI deep trench isolation (DTI) structure is manufactured in the form of staggered lines of trench, so as to ensuring optical isolation between the adjacent sensing elements of the pixel-array while maintaining the electrical continuity between said sensing elements. For a better understanding, FIG. 6 shows an example of a BSI optical sensor obtained according to a second embodiment of the proposed method. In particular, the top part of FIG. 6 represents a top-down view of the BSI optical sensor 600 and the bottom part represents a cross-sectional view of the BSI optical sensor 600 cut along the direction BB', displayed in the top part of FIG. 6. The optical sensor obtained according to this second embodiment includes:

- a front side FS surface 610 and a backside BS surface 611;
- a semiconductor substrate 601 having a first surface 601a and a second surface 601b facing each other;
- at least a first sensing element 602a and a second sensing element 602b formed in said semiconductor substrate and separated by a FS isolation structure (for example a shallow trench isolation (STI) structure) 603;

a front side voltage applying device 604 electrically connected to said at least first or second sensing elements from the FS surface 601*a* of said semiconductor substrate;

an insulating layer 606, formed as a multilayer, comprising at least a first interconnection layer 607 and a metal contact 608;

a carrier semiconductor substrate 609 attached to the frontside surface 610 of said optical sensor;

a backside BS deep trench isolation (DTI) structure, surrounding the at least one and second sensing element, created in form of staggered lines of trench 605, etched from said backside surface 601*b* and landing to the bottom side of the FS isolation structure 603, said BS DTI structure being filled with a first insulating material 605*a* (e.g. Silicon Oxide covering the side walls and the bottom of the trench and with a second conductive material 605*b* (e.g. W, Ti/W or Aluminum) filling the inside of said BS DTI structure.

Figure 7:
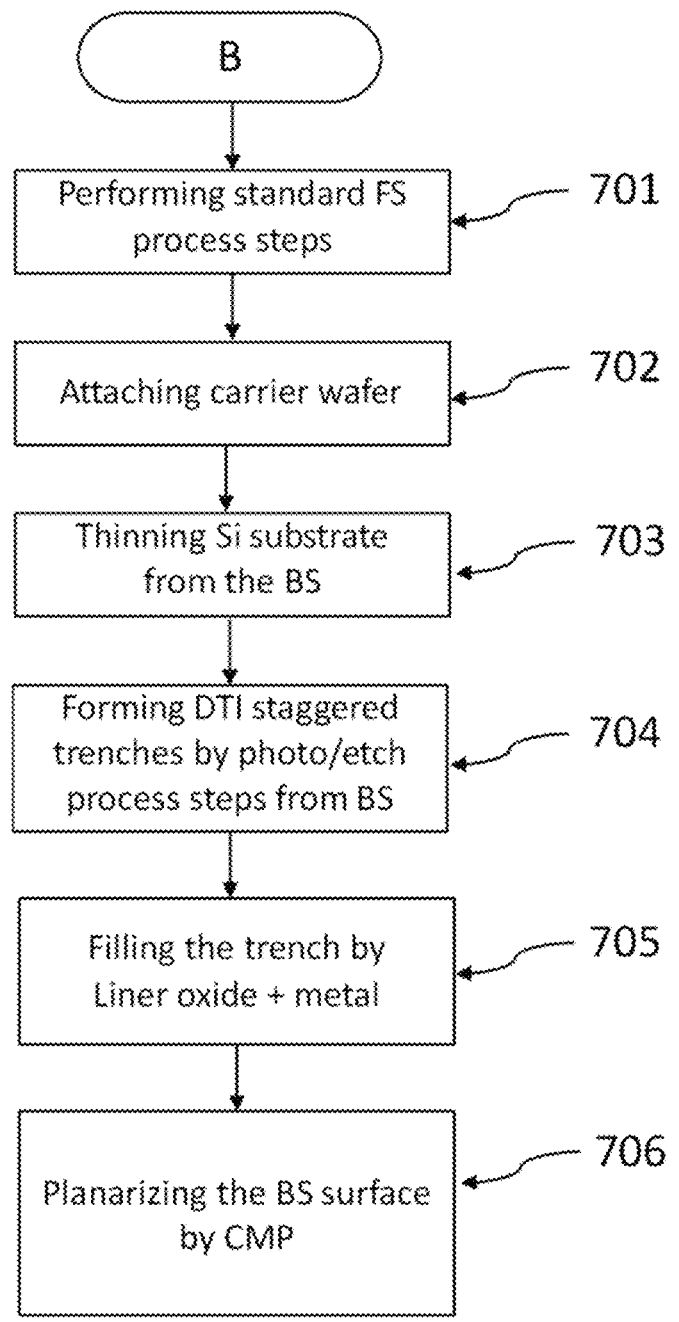
FIG. 7 shows the flow chart illustrating the method of manufacturing of the semiconductor BSI optical sensor according to a second embodiment.

According to a second embodiment of the present invention the BSI optical sensor 600 is manufactured according to the manufacturing process steps illustrated by the flow chart B in FIG. 7. According to this method, the manufacturing process comprises the following manufacturing steps: 701) performing a standard frontside manufacturing process comprising the steps of forming a FS isolation structure (for example a shallow trench isolation structure (STI)), a plurality of interconnection layers and a plurality of contacts/via structures arranged in a multilevel isolation structure; 702) attaching a carrier wafer to the frontside surface of said multilevel isolation structure; 703) partially remove the silicon substrate from the backside silicon surface; 704) forming BSI deep trench isolation (DTI) structure from backside by Photo/Etch process steps landing at the bottom side of the FS isolation structure, having the form of staggered lines of trench, separated by gaps, and surrounding each sensing element region; 705) depositing a first isolation layer covering the trench side and bottom walls of the DTI structure and a second conductive material, like Ti/W or Aluminum filling the internal of the BSI DTI structure; 706) planarizing the backside surface (e.g. by Chemical Mechanical Polishing, CMP) to remove all the conductive layer in excess on the backside surface.

The advantages of the present invention are clear from the foregoing. In particular, it is important to underline that the proposed solution consists in configuring the backside deep trench isolation structure in form of staggered lines of trench, running parallel to each other and surrounding adjacent sensing elements, said staggered lines of trench consisting of trench portions separated by gaps filled with silicon substrate, so as to insure electrical continuity between the sensing elements of the pixel-array (e.g. SPAD array) through these silicon gaps, and in the same time creating an optical barrier to the cross talk. According the aforementioned method the exposed silicon substrate in the photodiode region acts as second electrode for the sensing element and a common potential can be applied to each second electrode (FIG. 7).

Finally, it is clear that numerous modifications and variants can be made to the present invention, all falling within the scope of the invention, as defined in the appended claims.

The invention claimed is:

1. A method of manufacturing a backside illumination (BSI) CMOS optical sensor having improved cross talk and enhanced photon detection efficiency (PDE), said method comprising the following operations:

providing a semiconductor wafer having a semiconductor substrate, a first surface and a second surface, facing each other;

performing a standard CMOS frontside manufacturing process comprising the steps of forming at least a first sensing element and a second sensing elements in the substrate between said first and second semiconductor surface, forming at least one insulating layer on said semiconductor substrate first surface, at least a first interconnection layer and at least one metal contact, said at least first interconnection layer and said at least one metal contact being embedded in the at least one insulating layer;

providing a carrier semiconductor substrate and attaching said carrier semiconductor substrate to said at least one insulating layer;

thinning the semiconductor wafer by removing material from said semiconductor substrate second surface;

forming a backside deep trench isolation (DTI) structure in the substrate surrounding said at least first and second sensing elements, said DTI structure extending from the thinned second surface;

filling said DTI structure with first insulating material covering the side walls and the bottom of the trench and with a second conductive material filling the inside of said deep trench isolation (DTI) structure;

planarizing the semiconductor wafer from said thinned second surface, so as to expose said semiconductor substrate in the region of the at least first and second sensing elements, said at least first and second sensing elements being surrounded by said DTI structure; and forming a common voltage applying structure from said thinned second surface contacting said deep trench isolation (DTI) structure and said semiconductor substrate in the at least first and second sensing elements.

2. The method of claim 1, wherein said deep trench isolation (DTI) structure has the form of staggered lines of trench, each line of trenches consisting of trench portions separated by gaps filled with semiconductor substrate, said trench portions belonging to one line of trenches being staggered with respect to the trench portion belonging to the parallel line of trench, wherein said gaps between said trench portions are configured to provide a common voltage applying structure from said thinned second surface to said at least first and second sensing elements.

3. The method of claim 1, wherein said first insulating material is Silicon Oxide.

4. The method of claim 1, wherein said standard CMOS frontside manufacturing process further comprises the step of forming a first isolation structure in the semiconductor substrate surrounding said at least first and second sensing elements, said first isolation structure extending from said semiconductor first surface.

5. The method of claim 4, wherein said first isolation structure formed in the semiconductor substrate surrounding said at least first and second sensing elements is a Shallow Trench Isolation (STI) structure.

6. The method of claim 4, wherein said first isolation structure formed in the semiconductor substrate surrounding said at least first and second sensing elements is a LOCOS structure.

7. The method of claim 4, wherein said first isolation structure formed in the semiconductor substrate surrounding said at least first and second sensing elements is an implanted region.

8. The method of claim 1, wherein said deep trench isolation (DTI) structure has the form of a trench grid structure surrounding said at least first and second sensing element.

9. The method of claim 8, wherein the step of forming a common voltage applying structure from said thinned second surface contacting all said first and second sensing element comprises the step of forming a low resistivity layer on the thinned second surface connecting said trench grid structure and said semiconductor substrate in the at least first and second sensing elements.

10. The method of claim 9, wherein the step of forming said low resistivity layer on the thinned second surface comprises the following process steps: depositing an amorphous-silicon layer; doping said amorphous-silicon layer by implantation process; and annealing said amorphous-silicon layer by thermal laser anneal (LTA) or microwave anneal or other methodologies non impacting the underneath layers.

11. The method of claim 1, wherein said second conductive material is an opaque material.

12. The method of claim 11, wherein said opaque material is made of metal.

13. The method of claim 12, wherein said metal is chosen in a set composed of: Titanium, Titanium Nitride, Tungsten, Aluminum.

\* \* \* \* \*